United States Patent [19]

Aoki

[11] Patent Number: 5,204,833
[45] Date of Patent: Apr. 20, 1993

[54] METHOD AND APPARATUS FOR RECORDING WAVEFORM

[75] Inventor: Tadashi Aoki, Kawasaki, Japan

[73] Assignee: Canon Kabushiki Kaisha, Tokyo, Japan

[21] Appl. No.: 619,458

[22] Filed: Nov. 29, 1990

[30] Foreign Application Priority Data

Nov. 30, 1989 [JP] Japan ................................ 1-312686

[51] Int. Cl.[5] ........................................... G11C 13/00
[52] U.S. Cl. ........................................ 365/45; 365/73
[58] Field of Search ..................... 365/45, 73, 75, 76, 365/77

[56] References Cited

U.S. PATENT DOCUMENTS 4,024,512 5/1977 Amelio et al. .................... 365/73
4,318,188 3/1982 Hoffmann ......................... 365/73

Primary Examiner—Terrell W. Fears
Attorney, Agent, or Firm—Fitzpatrick, Cella, Harper & Scinto

[57] ABSTRACT

There is provided method and apparatus for recording a waveform. By counting the intervals of change points of a recorded waveform and recording the count data, the waveform can be recorded for a long time.

7 Claims, 2 Drawing Sheets

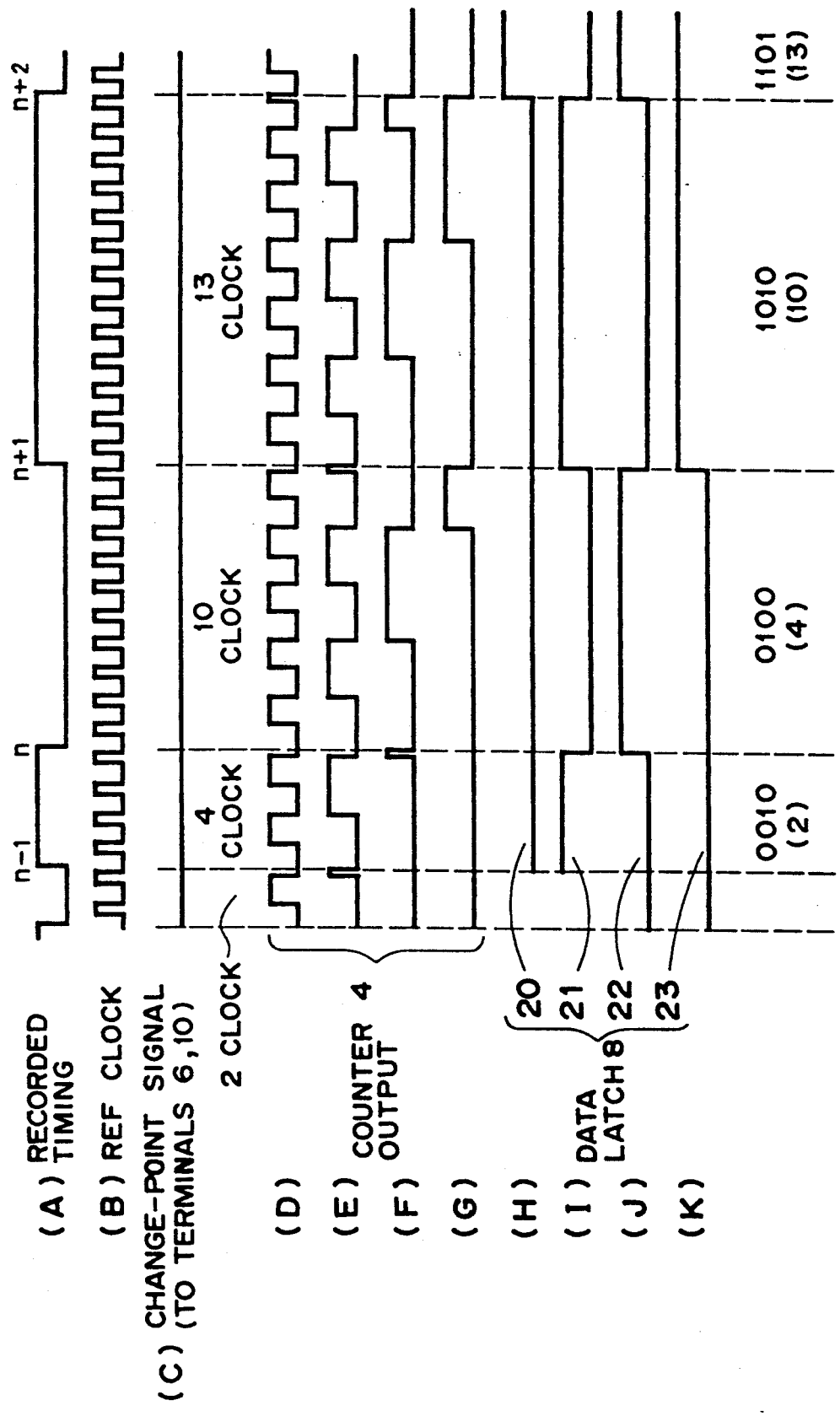

METHOD AND APPARATUS FOR RECORDING WAVEFORM

BACKGROUND OF THE INVENTION

1. Field of the Invention

The present invention relates to method and apparatus for recording a waveform.

2. Related Background Art

Hitherto, for instance, in logic analyzer, all of the data which were sampled by sampling clocks have been recorded into a memory.

However, in the above conventional example, since all of the data sampled every period of the sampling clocks have been recorded, it is impossible to record a timing waveform of a long time with a limited memory capacity.

SUMMARY OF THE INVENTION

It is the first object of the invention to enable a timing waveform of a long time to be recorded by a small memory capacity.

The second object of the invention is to realize a reduction of costs and a miniaturization of an apparatus by saving the memory capacity.

BRIEF DESCRIPTION OF THE DRAWINGS

FIGS. 2(A) to 2(K) are timing charts for explaining the embodiment of the invention;

FIG. 2(A) is a waveform diagram showing a recorded timing;

FIG. 2(B) is a waveform diagram of a reference clock;

FIG. 2(C) is a waveform diagram of a change point signal;

FIGS. 2(D) to 2(G) are waveform diagrams of signals which are output from 4-bit binary counter; and FIGS. 2(H) to 2(K) are waveform diagrams of signals which are output from a 4-bit data latch.

DETAILED DESCRIPTION OF THE PREFERRED EMBODIMENT

Figure 1:
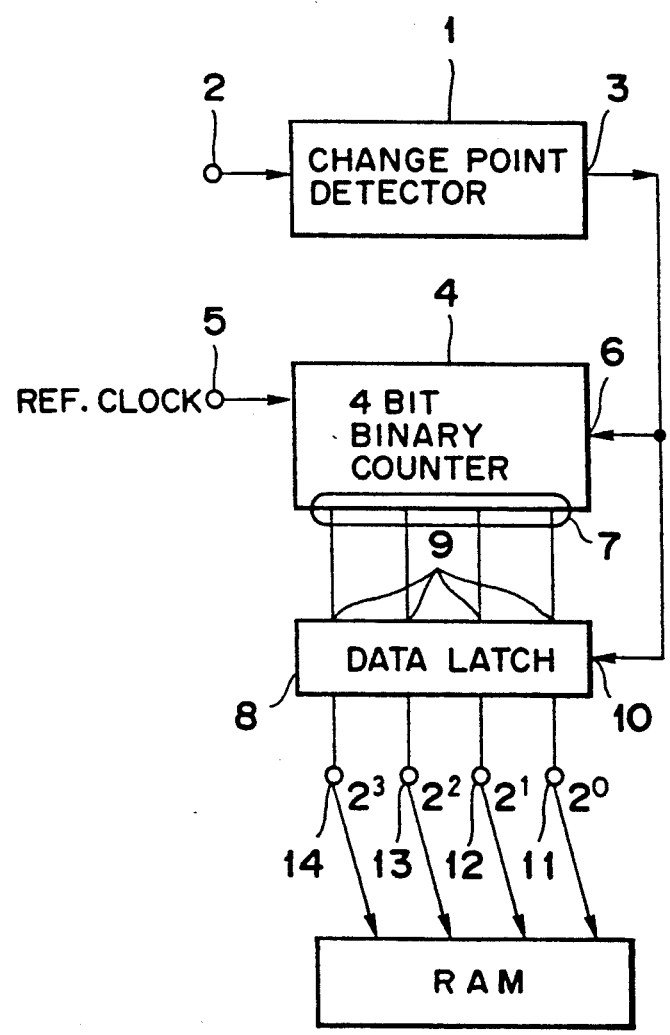
FIG. 1 is a block diagram of an embodiment of the invention.

FIG. 1 is a diagram showing an embodiment of the invention. In the diagram, reference numeral 1 denotes a change point detector for outputting a change point detection signal at a change point of a recorded timing waveform; 2 indicates an input terminal; 3 an output terminal; 4 a 4-bit binary counter for counting intervals of the change points; 5 a clock input terminal; 6 a reset input terminal; 7 an output terminal; 8 a data latch for temporarily storing count data; 9 a data input terminal 10 a latch/clock input terminal; 11 a $2^0$ output terminal; 12 a $2^1$ output terminal; 13 a $2^2$ output terminal; and 14 a $2^3$ output terminal.

In the above circuit, reference clocks are input to the clock terminal 5 of the 4-bit binary counter 4, the clocks are counted, and count data is output to the terminal 7. On the other hand, a recorded timing waveform is input to the change point detector 1, so that a change point detection signal is output. The change point detection signal is connected to the reset terminal 6 of the 4-bit binary counter 4 and to the latch/clock terminal 10 of the 4-bit data latch 8. When the nth change point detection signal is generated, the binary data indicative of the interval between the (n−1)th change point and the nth change point is stored into the 4-bit. data latch 8 for a period of time until the (n+1)th change point detection signal is generated.

FIG. 2 shows a timing chart for explaining the above operation.

The 4-bit binary counter 4 starts the counting operation in response to a trailing edge of the clock which is input to the input terminal 5. The binary counter 4 is reset when a reset signal which is input to the reset input terminal 6 is at the high level. The 4-bit data latch 8 latches the data in response to a leading edge of the latch clock which is input to the latch clock input terminal 10.

The binary counter 4 is reset by the nth change point signal. The binary counter 4 executes the counting operation for a period of time when the (n+1)th change point signal is input. When the (n+1)th change point signal is generated, the data of the binary counter 4 is latched into the data latch 8 and, at the same time, the binary counter 4 is reset.

Therefore, the count value corresponding to the number of clocks (for instance, 10) between the nth change point and the (n+1)th change point is latched into the data latch 8. By sequentially recording the latched data, a timing waveform to be measured can be expressed. The (n−1)th to (n+2)th waveforms can be respectively recorded by the 12-bit data which is constructed by "0100", "1010", and "1101" indicative of 4, 10 and 13.

According to the conventional method, data of 27 bits constructed by 111100000000001111111111111 is necessary in order to express that four clocks are at the level of "1" and ten clocks are at the level of "0" and thirteen clocks are at the level of "1".

The invention can not only be applied to a logic analyzer but also be used to compress data in the case of transferring data in a facsimile apparatus, a computer, and the like.

As described above, there is an effect such that by counting the intervals among the change points of a recorded waveform and by recording the count value data, a long waveform can be recorded by a small memory capacity.

I claim:

1. A method of recording a waveform of a digital signal, comprising the steps of:

detecting change points of a recorded timing waveform of a digital signal;

converting the plurality of detected change points into converted binary data corresponding to time intervals between respective pairs of said plurality of detected change points;

inputting the converted binary data in parallel to a memory; and recording the inputted data in the memory.

2. A method according to claim 1, wherein the data which is input from said plurality of transmission paths comprises data indicative of intervals among the change points of said recorded timing waveform in correspondence to each digit of the binary data.

3. A method according to claim 2, wherein the binary data is based on the numbers of reference clocks which are counted within the times among said plurality of change points.

4. A method according to claim 1, wherein the binary data is based on the numbers of reference clocks which are counted within the times among said plurality of change points.

5. An apparatus for recording a waveform of a digital signal, comprising:
   change point detecting means for detecting change points of a recorded timing waveform of a digital signal;
   counting means for counting intervals between respective pairs of detected change points, for converting said intervals into converted binary data; and
   memory means for receiving the converted binary data output from the counting means through a plurality of transmission paths corresponding to respective digits of the converted binary data and for recording the received data.

6. An apparatus according to claim 5, wherein the memory means comprises a data latch circuit of a predetermined number of bits, and the apparatus further has a memory (RAM) of a large capacity to store the binary data which is output from said data latch.

7. An apparatus for recording a waveform of a digital signal, comprising:
   change point detecting means for receiving a recorded timing waveform of a digital signal, for detecting change points of the waveform, and for outputting change point signals;
   counting means of a predetermined number of bits for receiving the change point signals input to the counting means from said change point detecting means and for counting reference clocks of a reference clock signal, and for converting numbers of reference clocks which are counted during intervals between pairs of said plurality of change points into converted binary data; and
   memory means for receiving the converted binary data output from said counting means through a plurality of transmission paths corresponding to said predetermined number of bits and for recording the received data.

* * * * *

UNITED STATES PATENT AND TRADEMARK OFFICE
CERTIFICATE OF CORRECTION

PATENT NO. : 5,204,833
DATED : April 20, 1993
INVENTOR(S) : TADASHI AOKI

It is certified that error appears in the above-identified patent and that said Letters Patent is hereby corrected as shown below:

<u>COLUMN 1</u>

Line 53, "terminal" should read --terminal;--.

<u>COLUMN 2</u>

Line 39, "among" should read --between--.
Line 57, "said plurality of transmission paths" should read --in parallel--.

Signed and Sealed this

Twenty-ninth Day of March, 1994

Attest:

BRUCE LEHMAN

Attesting Officer     Commissioner of Patents and Trademarks